United States Patent
Schelstraete

(10) Patent No.: US 6,968,000 B2
(45) Date of Patent: Nov. 22, 2005

(54) FILTER ARRANGEMENT WITH A LINEAR PHASE CHARACTERISTIC, AND METHOD TO DEVELOP SUCH A FILTER ARRANGEMENT

(75) Inventor: Sigurd Jan Maria Schelstraete, Schoten (BE)

(73) Assignee: Alcatel, Paris (FR)

(*) Notice: Subject to any disclaimer, the term of this patent is extended or adjusted under 35 U.S.C. 154(b) by 590 days.

(21) Appl. No.: 09/767,831

(22) Filed: Jan. 24, 2001

(65) Prior Publication Data

US 2001/0010704 A1 Aug. 2, 2001

(30) Foreign Application Priority Data

Feb. 2, 2000 (EP) .............................. 00400310

(51) Int. Cl.⁷ ................ H03K 5/159; H04B 1/10; H03H 7/30
(52) U.S. Cl. ................ 375/229; 375/350; 375/231
(58) Field of Search ................ 375/229, 300; 381/66; 348/725

(56) References Cited

U.S. PATENT DOCUMENTS 5,517,527 A * 5/1996 Yu .............................. 375/233
5,533,063 A * 7/1996 Mitra et al. ................. 375/340
5,963,273 A * 10/1999 Boie et al. .................. 348/725

OTHER PUBLICATIONS

Xiaoning Nie et al.: "On the Design and Realization of a Class of Tunable 2–D Digital Filters" Proceedings of the International Symposium on Circuits and Systems, US, New York, IEEE, vol. SYMP. 24, 1991, pp. 452–455, XP000384806.

* cited by examiner

Primary Examiner—Amanda T. Le
Assistant Examiner—Cicely Ware
(74) Attorney, Agent, or Firm—Sughrue Mion, PLLC

(57) ABSTRACT

A filter arrangement with a linear phase characteristic having first filter cascade coupled to second filter. The first filter is an analog or digital filter designed so that its amplitude characteristic meets a predefined amplitude specification. The second filter is implemented as the anti-causal version of a fictive digital all-pass filter that is designed so that its phase characteristic, up to a linear function of frequency, equals the phase characteristic of the first filter.

4 Claims, 3 Drawing Sheets

F1

APF
(CAUSAL ALL-PASS)

F2
(NON-CAUSAL VERSION OF APF)

FILTER ARRANGEMENT WITH A LINEAR PHASE CHARACTERISTIC, AND METHOD TO DEVELOP SUCH A FILTER ARRANGEMENT

BACKGROUND OF THE INVENTION

The present invention relates to a filler arrangement comprising a first filter having an amplitude characteristic that meets a redefined amplitude specification and having a phase characteristic that generally is a non-linear function of frequency and a second filter, cascade coupled to the first filter, the second filter having a phase characteristic that is, up to a linear function of frequency, substantially opposite to the phase characteristic of the first filter a and a method to develop such a filter arrangement by designing a first filter so that its amplitude characteristic meets a predefined amplitude specification implementing the first filter, determining a phase characteristic of the first filter, the phase characteristic being a non-linear function of frequency, implementing a second filter so that its phase characteristic is up to a linear function of frequency, substantially opposite to the phase characteristic of the first filter and cascade coupling the first filter and second filter.

Filter arrangements with linear phase characteristics are well-known in the art, and are typically constituted of a first filter with predefined amplitude characteristic and a cascade coupled second filter that is an all-pass filter which has approximately the opposite phase characteristic of the first filter (up to a linear function of frequency). The first filter may be an IIR (Infinite Impulse Response) filter that meets the predefined amplitude characteristics with a relatively low filter order, e.g. a third or fourth order filter, but whose phase characteristic is not a linear function of frequency. Such a filter causes non-linear phase distortions which are not acceptable in several applications. This is for instance so in a multi-carrier transmission system, such as an ADSL (Asymmetric Digital Subscriber Line) system based on DMT (Discrete Multi Tone) modulation, if peak/average power ratio (PAR) reduction techniques are applied because the non-linear phase distortions caused by the filter destroy most of the obtained PAR reduction. The phase distortion introduced by the first filter, designed to meet a given amplitude specification, is thus compensated for by a second filter. In the known filter arrangements with linear phase characteristic, this second filter is a causal digital all-pass filter (that is a digital all-pass filter whose current output sample depends on the current and previous input samples and on previous output samples) whose phase characteristic is designed to oppose, up to a linear function of frequency, the phase characteristic of the first filter. The phase of the cascade connection of the first filter and the causal all-pass filter is the sum of the phases of both filters and consequently is an approximately linear function of frequency, whereas the amplitude characteristic of the cascade connection of both filters is equal to the amplitude characteristic of the first filter. However, when the phase distortion of the first filter is severe, one typically needs a causal all-pass filter of relatively high order, e.g. a seventh or eighth order IIR all-pass filter, to achieve a good phase equalisation. Such high order all-pass filters are difficult to implement.

SUMMARY OF THE INVENTION

An aspect of the present invention is to provide a filter arrangement with a linear phase characteristic and a method to develop such a filter characteristic similar to the known ones, but wherein the order of the second, phase equalizing filter is substantially reduced without increasing the phase distortion.

Indeed, the anti-causal version of a causal filter (that is a filter whose current output samples exclusively depends on current and future input and future output samples) has a phase characteristic opposite to the phase characteristic of that causal filter. The anti-causal version of a fictive digital all-pass filter having a phase characteristic that is, up to a linear function of frequency, equal to the phase characteristic of a first filter therefore is an all-pass filter with a phase characteristic that is, up to a linear function of frequency, opposite to the phase characteristic of that first filter. When coupled in cascade to that first filter, the phase characteristic of that first filter is equalised, again up to a linear function of frequency, whereas the amplitude characteristic of the first filter is left unaffected. An anti-causal filter cannot be realised exactly in practice, but a number of methods are known that approximate anti-causal filtering. The order of such an anti-causal filter is equal to the order of the fictive digital all-pass filter it is derived from, which for applications such as ADSL typically allows to equalise the phase with a second order or third order anti-causal filter.

It is to be noticed that the term 'comprising', used in the claims, should not be interpreted as being limitative to the means listed thereafter. Thus, the scope of the expression 'a device comprising means A and B' should not be limited to devices consisting only of components A and B. It means that with respect to the present invention, the only relevant components of the device are A and B.

The by the first filter in the filter arrangement according to the present invention, may be an analog filter or digital filter.

BRIEF DESCRIPTION OF THE DRAWINGS

The above mentioned and other objects and features of the invention will become more apparent and the invention itself will be best understood by referring to the following description of an embodiment taken in conjunction with the accompanying drawings wherein.

DETAILED DESCRIPTION OF THE INVENTION

Figure 1:
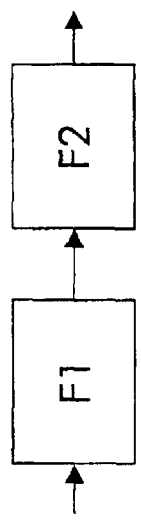
FIG. 1 is a block scheme of an embodiment of the filter arrangement according to the present invention.
Figure 2:
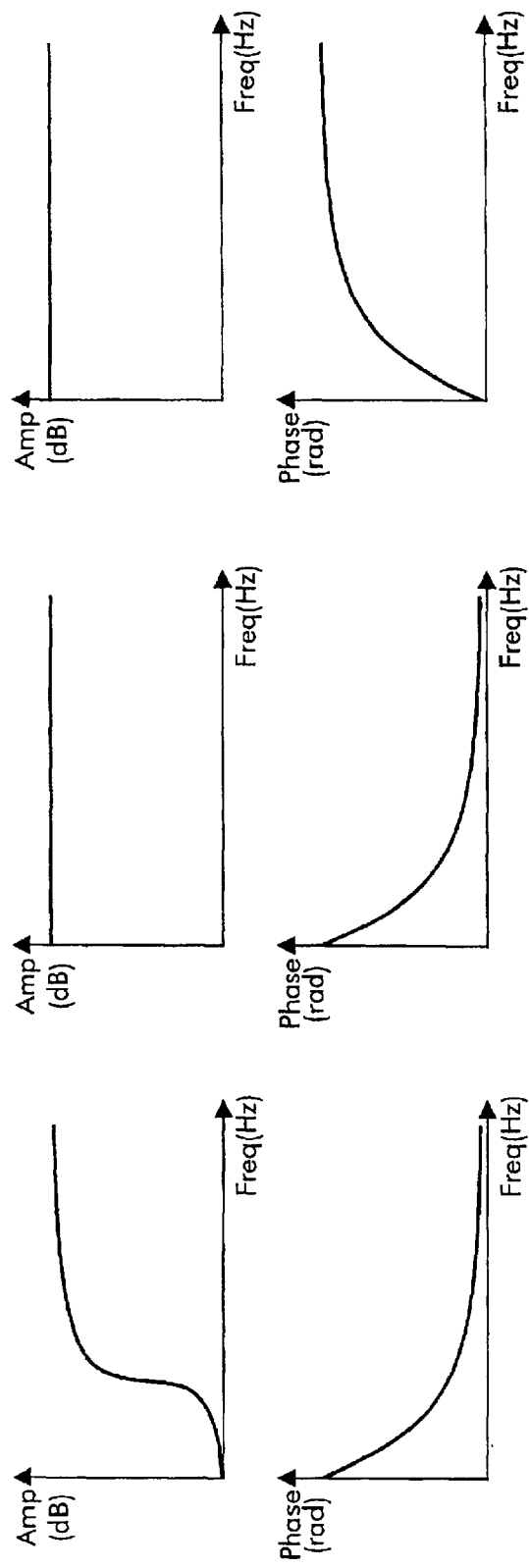
FIG. 2 shows the amplitude characteristics and phase characteristics of the first filter F1 drawn in FIG. 1, of a fictive digital all-pass filter APF, and of the second filter F2 drawn in FIG. 1.

The filter arrangement drawn in FIG. 1 consists of the cascade coupling of a first filter F1 and a second filter F2. The first filter F1 is an IIR filter whose amplitude and phase characteristics are drawn in the leftmost charts of FIG. 2. The first filter F1 has been designed and implemented so that its amplitude characteristic meets given amplitude specifications. From FIG. 2 it is seen that the amplitude characteristic has a high pass behaviour. The phase characteristic of the first filter F1 however is not a linear function of frequency. The second filter F2 is an anti-causal filter whose amplitude and phase characteristics are drawn in the rightmost charts of FIG. 2. The second filter F2 has been implemented as the anti-causal version of a causal all-pass filter APF whose amplitude and phase characteristics are drawn in the charts in the middle of FIG. 2. This causal all-pass filter APF is a fictive filter, i.e. a filter that has not been implemented but that has been designed so that its phase characteristic equals the phase characteristic of the first filter F1. The second filter F2 afterwards has been designed and implemented as the anti-causal version of the fictive all-pass filter APF, and consequently has a phase characteristic opposite to the phase characteristic of the fictive all-pass filter APF and of the first filter F1, whereas its amplitude characteristic remains flat. With every stable causal all-pass filter APF corresponds a stable anti-causal filter F2. This filter F2 has the amplitude behaviour of the original filter APF but the opposite phase, and its order is equal to that of the original filter APF. When cascade coupled with the first filter F1, the second filter F2 equalises the phase characteristic so that the filter arrangement shown in FIG. 1 has an aggregate amplitude characteristic equal to the amplitude characteristic of the first filter F1, and a null phase characteristic.

The anti-causal filter F2 can only be implemented in practice if the impulse response of this filter F2 is of finite length and if the input to be processed is also limited in time. This is so because output samples of an anti-causal filter exclusively depend on current and future input and future output samples. Once all the input has been received, the output samples of the anti causal filter F2 can be determined in reverse order, i.e. starting with the last sample. In fact, this is equivalent to sending the time-reversed input sequence through the causal all-pass filter APF and reversing the resulting output sequence in time. Obviously, this introduces a delay that is proportional to the length of the impulse response of the second filter F2. Because IIR (Infinite Impulse Response) filters always have an impulse response of infinite length, the just described approach is not directly applicable. However, in any physical realisation, the length of the impulse response function will be truncated by the finite word length, which leads to an effective finite length of the impulse response. For these systems, sequences of finite length can be processed by the anti-causal filter F2. Moreover, if the input is split into blocks of finite duration with an appropriate length, using an overlap and add method effectively allows one to process sequences of infinite length. The anti-causal filter F2 thus can be realized at the expense of an extra delay in the processing of the input signal.

Figure 3:
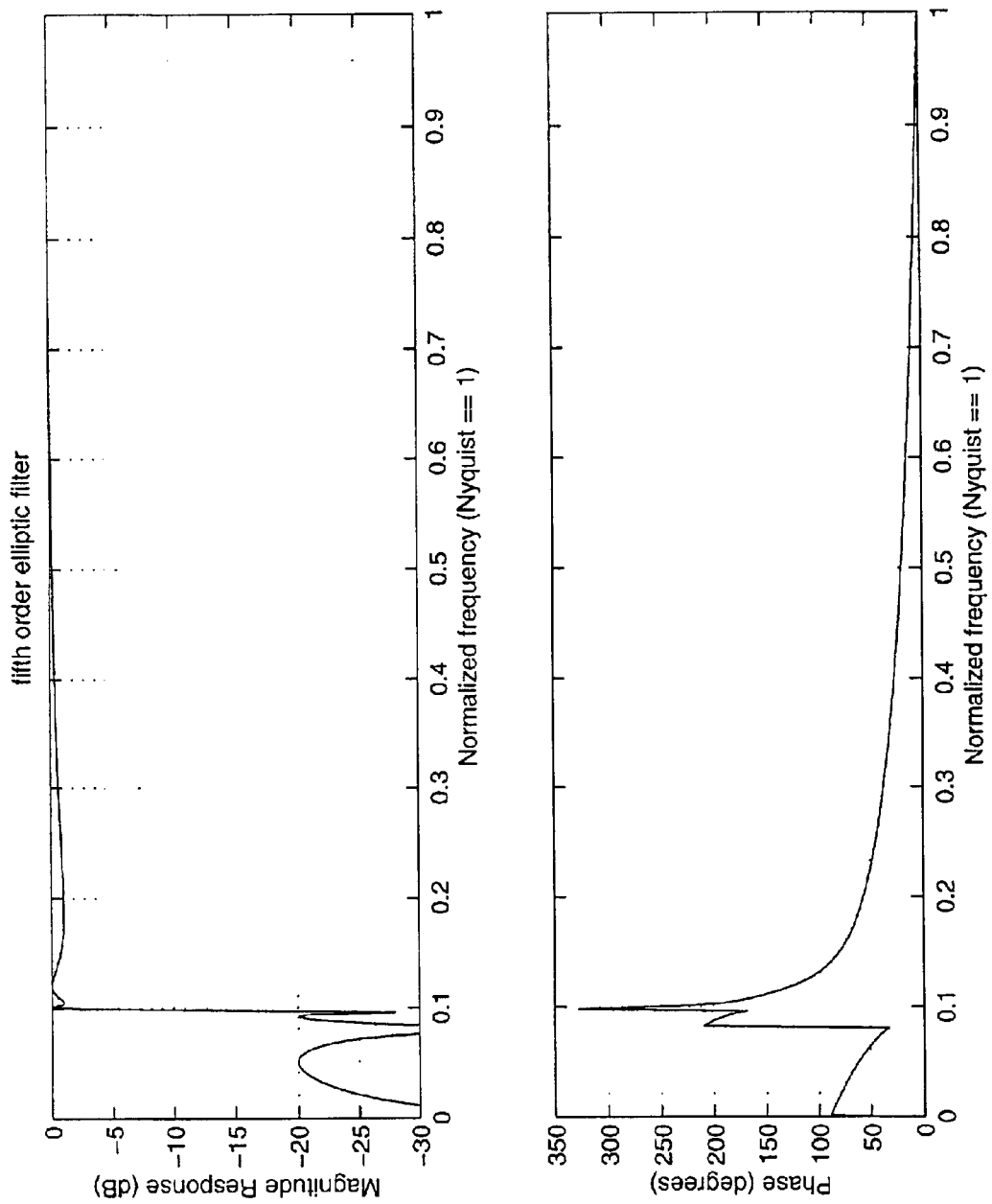
FIG. 3 shows the amplitude characteristic and phase characteristic of a fifth order elliptic filter whose phase has to be equalised according to the present invention.

Simulations with ADSL (Asymmetric Digital Subscriber line) modems have shown the need for phase equalisation in order to obtain efficient peak/average power reduction (PAR). FIG. 3 shows for instance a fifth order elliptic high-pass filter. Such an elliptic filter is notorious for introducing large phase distortions, especially near the edge of the pass-band where the sharp amplitude characteristic (see upper chart of FIG. 3) implies a strongly non-linear phase characteristic (see lower chart of FIG. 3). The filter illustrated by FIG. 3 has a 20 dB attenuation in the stop band and 1 dB ripple. The edge of the pass-band is at 10% of the Nyquist frequency and the charts in FIG. 3 have been normalised so that the Nyquist frequency corresponds to a frequency equal to 1. The phase of the fifth order elliptic high-pass filter of FIG. 3, need only be equalised in the pass-band since the frequency components in the stop-band are undesirable anyway and will be filtered out.

Figure 4:
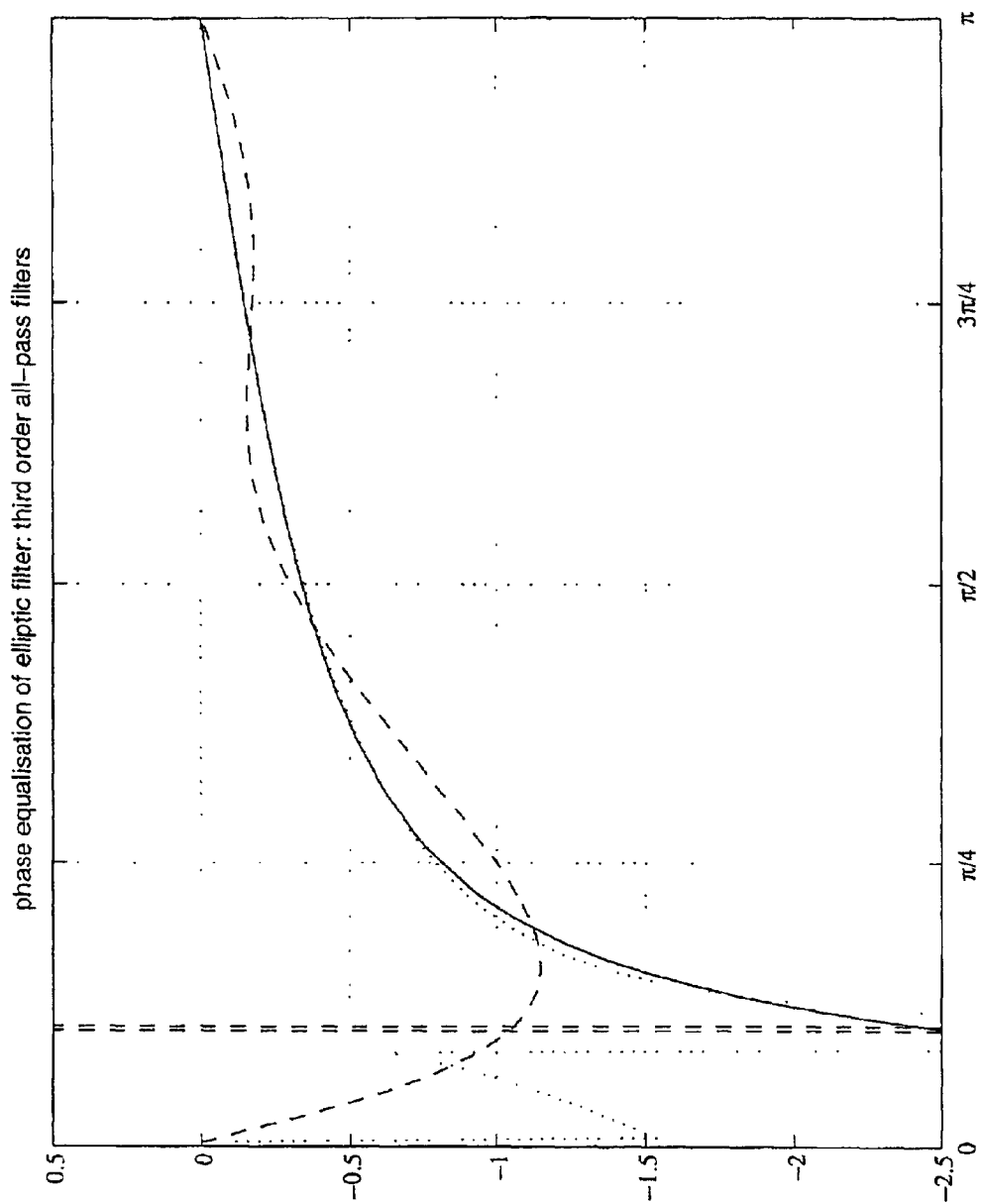
FIG. 4 shows the phase characteristic of an embodiment of the filter arrangement according to the present invention whose first filter is constituted by the fifth order elliptic filter of FIG. 3. The performance is compared with the traditional approach where a causal filter with opposite phase is designed to equalise the first filter.

FIG. 4 shows the results of the phase equalisation of the elliptic filter of FIG. 3, using a third order anti-causal all pass filter series coupled to the elliptic filter. The double dashed line in FIG. 4 indicates the edge of the pass-band. A causal all-pass filter was designed to have a phase equal to the phase of the elliptic filter of FIG. 3, while the anti-causal version of this causal all-pass filter was designed and implemented as described above. The linear component of the phase characteristic of the anti-causal filter has been subtracted in FIG. 4 wherein the phase characteristic of the so implemented anti-causal filter is represented by the full line. This phase characteristic in the pass-band nearly matches with the exact opposite phase characteristic of the elliptic filer of FIG. 3, represented by the dotted line in FIG. 4 and corresponding to perfect phase equalisation. The dashed line in FIG. 4 represents the phase equalisation that could be obtained when the traditional approach is used (i.e. a causal filter with opposite phase is designed). The comparison clearly indicates the better performance of the anti-causal all-pass filter.

It is remarked that the causal all-pass filter APF may have a phase that is exactly equal to the phase of the first filter F1, but alternatively may have a phase characteristic that is equal up to a linear function of frequency to the phase characteristic of the first filter F1. In the latter situation, the phase characteristic of the anti-causal filter F2 will oppose the phase characteristic of the first filter F1 up to a linear function of frequency so that the aggregate phase characteristic of the filter arrangement wherein the first filter F1 and second filter F2 are cascade coupled will be a linear function of frequency instead of a constant function. Such a linear phase characteristic does not cause unacceptable non-linear phase distortions.

It is also remarked that although implementation of the invention in an ADSL (Asymmetric Digital Subscriber Line) system has been suggested, any person skilled in the art of designing and implementing filter arrangements will understand from the above explanation that a filter arrangement with linear phase characteristic implemented according to the principles of the present invention, is also usable in other DSL (Digital Subscriber Line) systems like a VDSL (Very High Speed Digital Subscriber Line) system, an SDSL (Symmetrical Digital Subscriber Line) system, an HDSL (High Speed Digital Subscriber Line) system, or even in other communication systems wherein non-linear phase distortions are unacceptable, for instance because all effort for PAR reduction is destroyed thereby.

Furthermore, it is remarked that an embodiment of the present invention is described above rather in terms of functional blocks. From the functional description of these blocks it will be obvious for a person skilled in the art of designing filters how embodiments of these blocks can be manufactured with well-known electronic components. A detailed architecture of the contents of the functional blocks hence is not given.

While the principles of the invention have been described above in connection with specific apparatus, it is to be clearly understood that this description is made only by way of example and not as a limitation on the scope of the invention.

What is claimed is:

1. A filter arrangement with a linear phase characteristic comprising:
 a first filter having an amplitude characteristic that meets a predefined amplitude specification and having a phase characteristic that is a non-linear function of frequency; and a second filter, cascade coupled to said first filter, said second filter having a phase characteristic that is substantially equal to the sum of a linear function of frequency and the opposite phase characteristic of said first filter, wherein said second filter is an anti-causal version of a fictive digital all-pass filter having a phase characteristic that is substantially equal to the sum of a linear function of frequency and said phase characteristic of said first filter.

2. The filter arrangement according to claim 1, wherein said first filter is an analog filter.

3. The filter arrangement according to claim 1, wherein said first filter is a digital filter.

4. A method to develop a filter arrangement with a linear phase characteristic, wherein the method comprises:

designing a first filter so that its amplitude characteristic meets a predefined amplitude specification;

implementing said first filter;

determining a phase characteristic of said first filter, said phase characteristic being a non-linear function of frequency;

implementing a second filter so that its phase characteristic is substantially equal to the sum of a linear function of frequency and the opposite phase characteristic of said first filter; and cascade coupling said first filter and said second filter, wherein implementing said second filter comprises:

designing a fictive digital all-pass filter so that its phase characteristic is substantially equal to the sum of a linear function of frequency and equal said phase characteristic of said first filter; and implementing said second filter as an anti-causal version of said fictive digital all-pass filter.

* * * * *